(12) United States Patent
Adewole et al.

(10) Patent No.: US 7,244,626 B2
(45) Date of Patent: Jul. 17, 2007

(54) SEMICONDUCTOR DEVICES SHARED ELEMENT(S) APPARATUS AND METHOD

(75) Inventors: Hakeem B. Adewole, Schaumburg, IL (US); Paul W. Brazis, South Elgin, IL (US); Daniel R. Gamota, Palatine, IL (US); Jerzy Wielgus, Chicago, IL (US); Jie Zhang, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 283 days.

(21) Appl. No.: 10/881,389

(22) Filed: Jun. 30, 2004

(65) Prior Publication Data

US 2006/0003475 A1    Jan. 5, 2006

(51) Int. Cl.
*H01L 21/00* (2006.01)
(52) U.S. Cl. .......................... 438/22; 257/40
(58) Field of Classification Search ............ 438/22, 438/33, 382; 257/40, 64, 65, 70
See application file for complete search history.

(56) References Cited

U.S. PATENT DOCUMENTS

| 6,273,561 | B1* | 8/2001 | Ahn ............................. 347/86 |
| 6,934,570 | B2* | 8/2005 | Kiani et al. .................. 600/324 |
| 6,953,956 | B2* | 10/2005 | Or-Bach et al. ............. 257/203 |
| 2003/0020844 | A1* | 1/2003 | Albert et al. .................. 349/33 |
| 2004/0087063 | A1* | 5/2004 | Akhavin et al. ............. 438/127 |

OTHER PUBLICATIONS

Klauk, H., et al. "Fast Organic Thin Film Transistor Circuits." Jackson's Electronics Research Group IEEE Electron Device Letters. vol. 20, No. 6. Jun. 1999. pp. 289-291.
Ullmann, A., et al. "High Performance Organic Field-Effect Transistors and Integrated Inverters." © 2001 Materials Research Society. vol. 665. Pages C7.5.1-C7.5.6.

* cited by examiner

*Primary Examiner*—Phuc T. Dang

(57) ABSTRACT

Two or more semiconductor devices (21 and 22) are formed on a substrate (20) and are each comprised of a plurality of printed components (23 and 24). At least one such printed component (25) is shared by both such semiconductor devices.

25 Claims, 2 Drawing Sheets

```
┌─────────────────────────────┐ ⟋11
│ PROVIDE A SHARED SUBSTRATE  │
└─────────────────────────────┘
              │
              ▼
┌──────────────────────────────────────┐ ⟋12
│  FORM 1ST AND 2ND SEMICONDUCTOR      │
│  DEVICES ON THE SHARED SUBSTRATE     │
│  THAT SHARE AT LEAST ONE INTEGRAL    │
│  PRINTED DEVICE ELEMENT COMPRISED    │
│       OF AT LEAST ONE INK            │
└──────────────────────────────────────┘
                  10
```

SEMICONDUCTOR DEVICES SHARED ELEMENT(S) APPARATUS AND METHOD

TECHNICAL FIELD

This invention relates generally to semiconductor devices and more particularly to semiconductor devices that have at least one printed device element.

BACKGROUND

Methods and apparatus that use such techniques as vacuum deposition to form semiconductor-based devices of various kinds are well known. Such techniques serve well for many purposes and can achieve high reliability, small size, and relative economy when applied in high volume settings. Recently, other techniques are being explored to yield semiconductor-based devices. For example, organic semiconductor materials can be provided as a functional ink and used in conjunction with various printing techniques to yield printed semiconductor devices.

Printed semiconductor devices, however, yield considerably different end results and make use of considerably different fabrication techniques than those skilled in the art of semiconductor manufacture are prone to expect. For example, printed semiconductor devices tend to be considerably larger than typical semiconductor devices that are fabricated using more traditional techniques. As other examples, both the materials employed and the deposition techniques utilized are also well outside the norm of prior art expectations.

Due in part to such differences, in many cases existing materials and techniques are not suitable for use and deployment with respect to printed semiconductor devices. Further, in many cases, semiconductor device printing gives rise to challenges and difficulties that are without parallel in prior art practice. As one example, printed semiconductor devices tend to be larger than their prior art counterparts.

BRIEF DESCRIPTION OF THE DRAWINGS

The above needs are at least partially met through provision of the semiconductor devices shared element(s) apparatus and method described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Generally speaking, pursuant to these various embodiments, at least two semiconductor devices are formed on a shared substrate. In a preferred approach these semiconductor devices share at least one integral printed device element comprised of at least one ink. The shared device element can comprise, for example, a dielectric layer, a bias electrode, and so forth. So configured, considerable improvements regarding required size and form factors can often be anticipated. Improvements can also often be expected with respect to product yield, power consumption, switching times, form factor flexibility, and the like.

These and other benefits will become more evident to those skilled in the art upon making a thorough review and study of the following detailed description.

Figure 1:
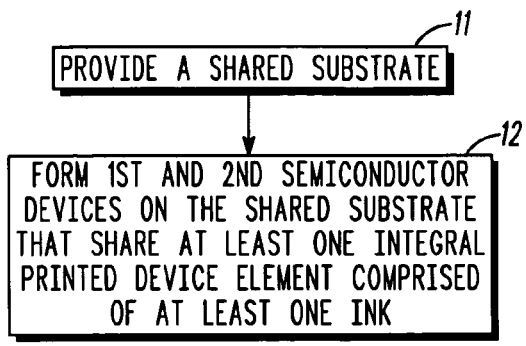
FIG. 1 comprises a flow diagram as configured in accordance with various embodiments of the invention.

Referring now to the drawings, and in particular to FIG. 1, an overall process 10 representative of these various teachings comprises provision 11 of a shared substrate and formation 12 of at least a first and second semiconductor device on the shared substrate, wherein the first and second semiconductor devices additionally share at least one integral printed device element comprised of at least one ink.

The shared substrate can comprise any suitable material including various rigid and non-rigid materials. In a preferred embodiment, the shared substrate comprises a flexible shared substrate comprised, for example, of polyester or paper. The substrate can be comprised of a single substantially amorphous material or can comprise, for example, a composite of differentiated materials (for example, a laminate construct). In a typical embodiment the shared substrate will comprise an electrical insulator though for some applications, designs, or purposes it may be desirable to utilize a material (or materials) that tend towards greater electrical conductivity.

The shared integral printed device element comprises ink as noted above. In a preferred embodiment, other elements of the semiconductor devices also comprise one or more inks including the semiconductor material portions of these devices. Those skilled in the printing arts are familiar with both graphic inks and so-called functional inks (wherein "ink" is generally understood to comprise a suspension, solution, or dispersent that is presented as a liquid or paste, or a powder (such as a toner powder). These functional inks are further comprised of metallic, organic, or inorganic materials having any of a variety of shapes (spherical, flakes, fibers, tubes) and sizes ranging, for example, from micron to nanometer. Functional inks find application, for example, in the manufacture of some membrane keypads. Though graphic inks can be employed as appropriate in combination with this process 10, these inks are more likely, in a preferred embodiment, to comprise a functional ink.

In a preferred approach, such inks are formed 12 on the substrate by use of a corresponding printing technique. Those familiar with traditional semiconductor fabrication techniques such as vacuum deposition will know that the word "printing" is sometimes used loosely in those arts to refer to such techniques. As used herein, however, the word "printing" is used in a more mainstream and traditional sense and does not include such techniques as vacuum deposition that involve, for example, a state change of the transferred medium in order to effect the desired material placement. Accordingly, "printing" will be understood to include such techniques as screen printing, offset printing, gravure printing, xerographic printing, flexography printing, inkjetting, microdispensing, stamping, and the like. It will be understood that these teachings are compatible with the use of a plurality of such printing techniques during fabrication of a given semiconductor device. For example, it may be desirable to print a first device element (or portion of a device element) using a first ink and a first printing process and a second, different ink using a second, different print process for a different device element (or portion of the first device element).

Figure 2:
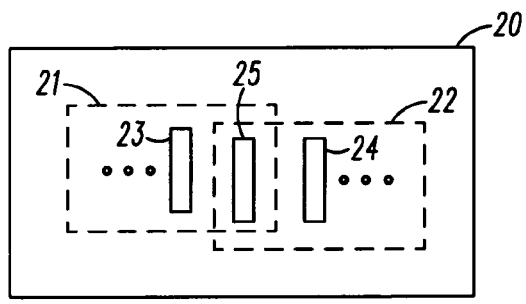
FIG. 2 comprises a logical schematic view as configured in accordance with various embodiments of the invention.

Accordingly, and referring now to FIG. 2, a first plurality of elements 23 as comprise a first semiconductor device 21 can be printed on a printing substrate 20 along with a second plurality of elements 24 as comprise a second semiconductor device 22, such that at least one element 25 of the first plurality of elements 23 also comprises an element of the second plurality of elements 24. As will be described in more detail below, the shared integral printed device element 25 (or elements) can comprise any of a variety of semiconductor device elements including, but not limited to, a dielectric layer, a bias electrode (such as a gate, source, or drain), or even a semiconductor element. Such a configuration serves particularly well when using the two or more semiconductor devices to form a multi-active device circuit (such as, but not limited to, an inverter circuit).

Figure 3:
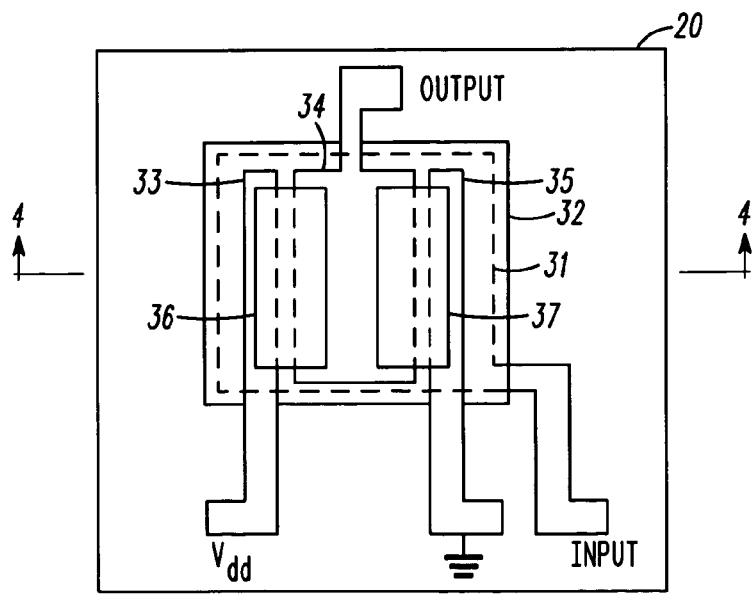
FIG. 3 comprises a top plan view as configured in accordance with various embodiments of the invention.
Figure 4:
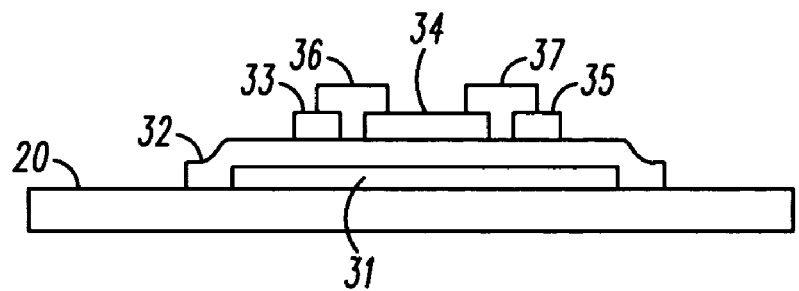
FIG. 4 comprises a side elevational view as corresponds to FIG. 3.

For purposes of illustration, and referring now to FIGS. 3 and 4, a more specific example of an inverter will be presented (those skilled in the art will recognize that this example serves only as an illustrative non-exhaustive example and that these teachings are readily employable in a wide variety of other settings and configurations). A bias electrode (comprising, in this example, a gate 31 having a corresponding INPUT pad) is printed on a substrate 20 of choice using a conductive ink of choice (such as but not limited to a functional ink containing copper or silver, such as DuPont's Ag 5028 combined with 2% 3610 thinner). Pursuant to one approach, air is blown over the printed surface after a delay of, for example, four seconds. An appropriate solvent can then be used to further form, define, or otherwise remove excess material from the substrate. Thermal curing at around 120 degrees Centigrade for 30 minutes can then be employed to assure that the printed gate will suitably adhere to the substrate.

A dielectric layer 32 is then printed over at least a substantial portion of the gate 31 using, for example, an appropriate epoxy-based functional ink (such as, for example, DuPont's 5018A ultraviolet curable material). By one approach, the dielectric layer 32 comprises a laminate of four or five layers. When so fabricated, each layer can be cured under an ultraviolet lamp for around 40 seconds before applying a next layer.

Additional electrodes are then again printed and cured using, for example, a copper or silver-based electrically conductive functional ink (such as, for example, DuPont's Ag 5028 with 2% 3610 thinner). These additional electrodes comprise in this embodiment a source electrode 33 that couples to a $V_{dd}$ pad, a drain/source electrode 34 that couples to an OUTPUT pad, and a drain electrode 35 that couples to a ground pad.

A semiconductor material ink, such as an organic semiconductor material ink, is then printed to provide a first area 36 of semiconductor material that bridges the gap between the source electrode 33 and the drain/source electrode 34 and a second area 37 of semiconductor material that bridges the gap between the drain/source electrode 34 and the drain electrode 35. (If desired, differing semiconductor materials can be used for each of the resultant devices to derive, for example, transistor devices that differ from one another with respect to their electrical characteristics, their environmental robustness, and so forth. Additional information regarding the use of differing semiconductor materials in a shared integrated structure appears in attorney's docket number CML00960T entitled Multiple Semiconductor Inks Apparatus and Method as filed on even date herewith and as assigned to a common assignee with the present application, the contents of which are incorporated herein by this reference.)

So configured, two separate transistors are formed wherein, in this embodiment, each transistor has a corresponding discrete semiconductor element 36 or 37. At the same time, however, each transistor also shares with the other transistor the gate electrode 31, the dielectric layer 32, and the drain/source electrode 34. As to the latter, the drain/source electrode 34 serves as the drain for the transistor having the semiconductor material 36 on the left side of the illustration and also serves as the source for the transistor having the semiconductor material 37 on the right side of the illustration. Such sharing and integration serves to permit smaller overall device size, facilitates printing yield, potentially faster switching speeds, and potentially reduced power consumption requirements.

Figure 5:
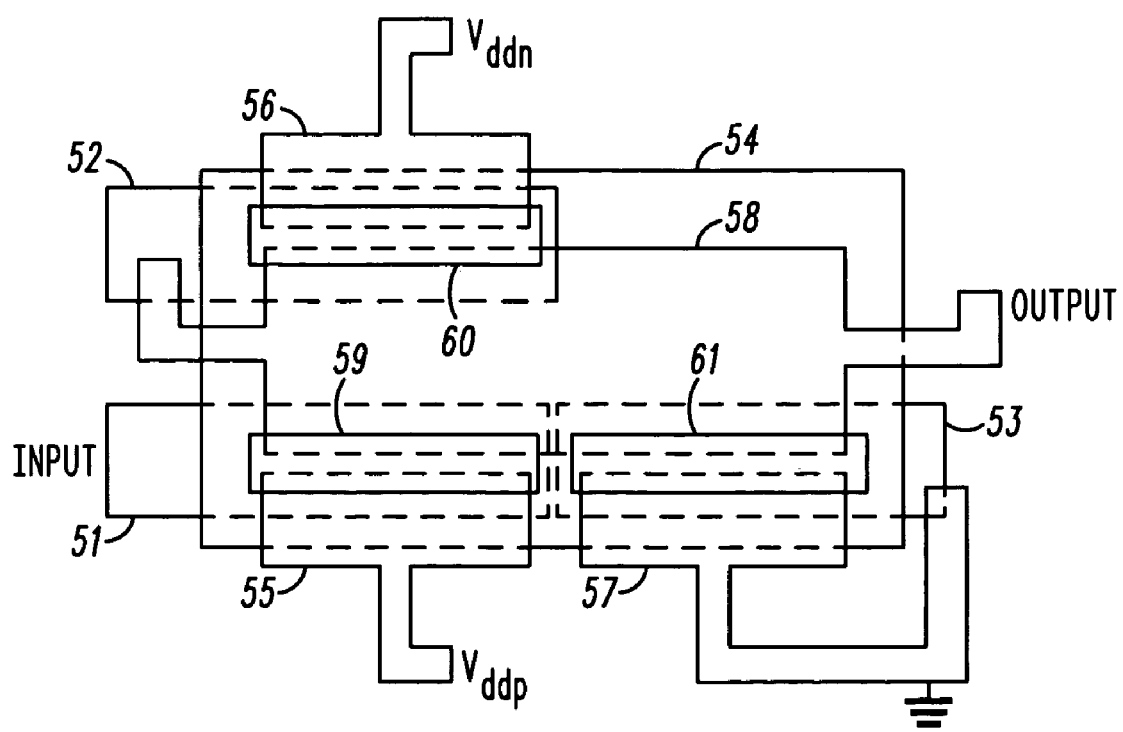
FIG. 5 comprises a top plan view as configured in accordance with various other embodiments of the invention.

As noted earlier, more than two such semiconductor devices can share integral printed device elements in this fashion. To further illustrate this point, a description of a three-transistor inverting amplifier will now be provided with reference to FIG. 5. In this embodiment, three gate electrodes 51, 52, and 53 are formed on a substrate 50, with the first gate 51 serving as an input, the second gate 52 serving as a feedback input, and the third gate 53 being further coupled as described below. A shared dielectric layer 54 is then formed over a significant portion of these gates 51, 52, and 53 and additional electrodes are then formed thereover. A first electrode 55 comprises a source of a first transistor and couples to $V_{ddp}$. A second electrode 56 comprises a source for a second transistor and couples to $V_{ddn}$. A third electrode 57 comprises a part of a third transistor and couples both to ground and to the gate 53 of that same transistor. Lastly, a fourth electrode 58 is shared by all three transistors while also serving as an output electrode for the resultant three-transistor inverting amplifier. This fourth electrode 58 serves as a drain for each of the three transistors and also couples to the gate 52 of one of the transistors.

Lastly, each of these three transistors has a corresponding printed area of organic semiconductor material 59, 60, and 61. So configured, a three-transistor integrated inverting amplifier can be readily fabricated in a manner that reduces required substrate area and therefore concurrently permits increased component density. The applicants have demonstrated size reductions of at least 50% as compared to a prior art counterpart. These approaches also have the potential to reduce power requirements and switching times (for example, response time and/or signal transfer time as between two such integrated devices). These teachings also permit, in general, use of easier and more reliable high volume printing techniques due to reduced sub-circuit features and complexity.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A method to facilitate fabrication of at least two semiconductor devices on a shared substrate comprising:
   providing the shared substrate;
   forming at least a first and second semiconductor device on the shared substrate, wherein the first and second semiconductor devices additionally share at least one integral printed device element comprised of at least one ink.

2. The method of claim 1 wherein providing the shared substrate further comprises providing a flexible shared substrate.

3. The method of claim 2 wherein providing a flexible shared substrate further comprises providing a polyester shared substrate.

4. The method of claim 1 wherein forming at least a first and second semiconductor device on the shared substrate further comprises forming at least a first and second semiconductor device on the shared substrate, wherein the first and second semiconductor devices additionally share at least a dielectric layer.

5. The method of claim 1 wherein forming at least a first and second semiconductor device on the shared substrate, wherein the first and second semiconductor devices additionally share at least one integral printed device element comprised of at least one ink further comprises forming at least a first and second semiconductor device on the shared substrate, wherein the first and second semiconductor devices additionally share at least a bias electrode.

6. The method of claim 1 wherein forming at least a first and second semiconductor device on the shared substrate, wherein the first and second semiconductor devices additionally share at least one integral printed device element comprised of at least one ink further comprises forming at least a first and second semiconductor device that each have a corresponding discrete semiconductor element.

7. The method of claim 1 wherein forming at least a first and second semiconductor device on the shared substrate, wherein the first and second semiconductor devices additionally share at least one integral printed device element comprised of at least one ink further comprises forming at least a first and second semiconductor device that each share a discrete semiconductor element.

8. The method of claim 1 wherein forming at least a first and second semiconductor device on the shared substrate, wherein the first and second semiconductor devices additionally share at least one integral printed device element comprised of at least one ink further comprises forming a multi-active device circuit.

9. The method of claim 8 wherein forming a multi-active device circuit further comprises forming an inverter circuit.

10. The method of claim 9 wherein the inverter circuit consists of at least three semiconductor devices, wherein all three of the at least three semiconductor devices share at least a bias electrode.

11. An apparatus comprising:
    a substrate;
    a first semiconductor device formed on the substrate and being comprised of a first plurality of printed elements comprised of at least one ink;
    a second semiconductor device formed on the substrate and being comprised of a second plurality of elements, wherein at least one element of the second plurality of elements comprises an element that further comprises an element of the first plurality of printed elements.

12. The apparatus of claim 11 wherein the substrate comprises a flexible substrate.

13. The apparatus of claim 12 wherein the flexible substrate comprises a polyester substrate.

14. The apparatus of claim 12 wherein the flexible substrate comprises a paper substrate.

15. The apparatus of claim 11 wherein the at least one element of the second plurality of elements that comprises an element that further comprises an element of the first plurality of printed elements comprises a dielectric layer.

16. The apparatus of claim 11 wherein the at least one element of the second plurality of elements that comprises an element that further comprises an element of the first plurality of printed elements comprises a bias electrode.

17. The apparatus of claim 16 wherein the bias electrode comprises a drain electrode of the first semiconductor device and a source electrode of the second semiconductor device.

18. The apparatus of claim 11 wherein the at least one element of the second plurality of elements that comprises an element that further comprises an element of the first plurality of printed elements comprises a semiconductor element.

19. The apparatus of claim 11 wherein at least one of the second plurality of elements is printed on the substrate.

20. The apparatus of claim 19 wherein all of the second plurality of elements are printed on the substrate.

21. A method comprising:
    providing a printing substrate;
    printing, on the printing substrate, each of:
      a first plurality of elements as comprise a first semiconductor device; and
      a second plurality of elements as comprise a second semiconductor device;
    such that at least one element of the first plurality of elements also comprises one of the second plurality of elements.

22. The method of claim 21 wherein printing comprises at least one of:
    screen printing;
    offset printing;
    gravure printing;
    xerographic printing;
    flexography printing;
    inkjetting;
    microdispensing;
    stamping.

23. The method of claim 21 wherein the at least one element comprises a dielectric element.

24. The method of claim 21 wherein the at least one element comprises a bias electrode.

25. The method of claim 21 wherein the at least one element comprises a semiconductor element.

* * * * *